US010515780B1

(12) United States Patent
Nouri

(10) Patent No.: US 10,515,780 B1
(45) Date of Patent: Dec. 24, 2019

(54) SYSTEM AND METHOD OF ARC DETECTION USING DYNAMIC THRESHOLD

(71) Applicant: Axcelis Technologies, Inc., Beverly, MA (US)

(72) Inventor: Yusef Nouri, Beverly, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 16/225,298

(22) Filed: Dec. 19, 2018

(51) Int. Cl.
*H01J 37/317* (2006.01)
*H01J 37/08* (2006.01)
*H01J 37/24* (2006.01)
*H01J 37/302* (2006.01)
*H01J 37/248* (2006.01)

(52) U.S. Cl.
CPC .......... *H01J 37/3171* (2013.01); *H01J 37/08* (2013.01); *H01J 37/241* (2013.01); *H01J 37/248* (2013.01); *H01J 37/3023* (2013.01); *H01J 2237/0206* (2013.01); *H01J 2237/0432* (2013.01); *H01J 2237/2485* (2013.01)

(58) Field of Classification Search
USPC .................................................... 250/492.21
See application file for complete search history.

(56) References Cited

U.S. PATENT DOCUMENTS

| 7,507,977 B2 | 3/2009 | Weiguo et al. |
| 7,566,887 B2 | 7/2009 | Huang et al. |
| 2012/0003760 A1* | 1/2012 | Lubicki ................. H01J 37/241 438/10 |

* cited by examiner

*Primary Examiner* — Kiet T Nguyen
(74) *Attorney, Agent, or Firm* — Eschweiler & Potashnik, LLC

(57) ABSTRACT

The present invention is directed to circuits, systems, and methods to quickly to quench an arc that may form between high voltage electrodes associated with an ion source to shorten the duration of the arc and mitigate non-uniform ion implantations. In one example, an arc detection circuit for detecting an arc in an ion implantation system includes an analog-to-digital converter (ADC) and an analysis circuit. The ADC is configured to convert a sensing current indicative of a current being supplied to an electrode in the ion implantation system to a digital current signal that quantifies the sensing current. The analysis circuit is configured to analyze the digital current signal to determine if the digital current signal meets threshold parameter value and in response to the digital current signal meeting the threshold parameter value, provide an arc detection signal to a trigger control circuit that activates an arc quenching mechanism.

22 Claims, 9 Drawing Sheets

SYSTEM AND METHOD OF ARC DETECTION USING DYNAMIC THRESHOLD

FIELD OF THE INVENTION

The present invention relates generally to ion implantation systems, and more particularly to an arc detection circuit and method that detects an arc that may form within an ion implantation system.

BACKGROUND OF THE INVENTION

Ion implantation systems are used to impart impurities, known as dopant elements, into semiconductor substrates or wafers, commonly referred to as workpieces. In such systems, an ion source ionizes a desired dopant element, and the ionized impurity is extracted from the ion source as a beam of ions. The ion beam is directed (e.g., swept) across respective workpieces to implant ionized dopants within the workpieces. The dopant ions alter the composition of the workpieces causing them to possess desired electrical characteristics, such as may be useful for fashioning particular semiconductor devices, such as transistors, upon the substrates.

The continuing trend toward smaller electronic devices has presented an incentive to "pack" a greater number of smaller, more powerful and more energy efficient semiconductor devices onto individual wafers. This necessitates careful control over semiconductor fabrication processes, including ion implantation and more particularly the uniformity of ions implanted into the wafers. Moreover, semiconductor devices are being fabricated upon larger workpieces to increase product yield. For example, wafers having a diameter of 300 mm or more are being utilized so that more devices can be produced on a single wafer. Such wafers are expensive and, thus, make it desirable to mitigate waste, such as having to scrap an entire wafer due to non-uniform ion implantation. Larger wafers and high density features make uniform ion implantation challenging, however, since ion beams have to be scanned across larger angles and distances to reach the perimeters of the wafers, yet not miss implanting any region there between.

In addition, high voltages supplied to the ion source for such an ion beam are subject to occasional arcing between the various high voltage electrodes and other nearby parts. This tendency for arcing often fully discharges one or more affected high voltage (HV) power supplies until the arc naturally self-extinguishes at a much lower supply voltage. While arcing, the beam current may become erratic or may be interrupted until the supply voltage is restored, during which time ion implantation may experience intermittent or non-uniform dose levels across the workpiece.

Arcing can occur if a film forms on a surface during the course of processing/implanting wafers, whereby the film becomes delaminated and falls in a high voltage gap between two electrodes. The film may also become charged and embedded in the ion beam until it is transported downstream across a high voltage gap that precipitates an arc. The arcing may ablate the film material, thus generating a large amount of particles which may also become embedded in the wafer. Arcing can also occur after insulators and/or feedthroughs become coated with process material or byproducts to the point that their insulation values become insufficient to isolate the HV, resulting in an arc that may track across the insulator/feedthrough and ablate material, restoring some amount of insulation value repeatedly until the HV power supply can be maintained, or the implantation system is taken out of service. Arcing can also occur due to vacuum leaks and/or pressure bursts near high voltage stress fields.

Arcs may form between at least one high voltage electrode and another conductive component. Three different types of arcing are illustrated in a conventional ion implantation system 10 shown in FIG. 1. A first arc type 12 occurs between an ion source electrode 14 (which is at a positive potential) and an extraction ground electrode 16. A second arc type 18 occurs between a suppression electrode 20 (which is at a negative potential) and the ground electrode 16 or other grounded electrode that is proximate the suppression electrode. The first arc type 12 can sometimes induce or cascade into an additional arc of the second arc type 18. These first and second arc types 12, 18 may be caused by mistuning of the ion implantation system 10 due to a software or operator error. A third arc type 22 occurs between an electrode (e.g., the ion source electrode 14) and a housing 24 that is proximate the electrode. Other types of arcing include arcing between two electrodes of the same polarity, such as between a terminal bias electrode and a terminal suppression electrode. Arcing to the beamline surrounding any electrode at potential is often present as well.

FIG. 1 further illustrates a high positive voltage extraction supply 26 that feeds extraction slits of the source electrode 14, and a high negative voltage suppression supply 28 that feeds the suppression electrodes 20 neighboring the ground electrodes 16. The HV suppression supply 28 has a conventional arc suppression or protection circuit 30, which may use a current limiting resistor 32 to limit the arc current to the suppression electrodes 20, a capacitor 34 to filter and stabilize the voltage of the supply, and a fly-back diode 36 to limit any reverse voltages generated from reactive elements of the circuit during arc on-off cycling.

Conventionally, the arc protection circuit 30 limits the arc current based on a fixed threshold current. Use of a fixed threshold current, however, can limit the effectiveness of an arc protection circuit 30 because the threshold should be set high enough to avoid false triggering. However, due to different process recipes and operating conditions, the current being supplied by the various power supplies may vary enough to make a fixed threshold current ineffective for detecting some arcing conditions in a timely manner, if at all. Accordingly, there is a need for detecting an arc under various circumstances to allow for mitigation of the effects of high voltage arcing associated with an ion source or various electrodes of an ion implantation system.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention is directed to an arc detection circuit for detecting an arc that may form between high voltage (HV) electrodes associated with an ion implantation system. The detection of the arc, for example, may be utilized for triggering an arc quenching mechanism that shortens the duration of the arc. Further, erratic ion beam current and non-uniform ion implantations may be mitigated according to the present disclosure. While ion source electrodes will provide the context for some portions of this description, it is to be understood that the arc detection circuit may be used for any HV electrodes, including various electrodes in an ion implantation system that shape the beam, provide energy filtering of the beam, or scan or otherwise manipulate the beam.

In one example, the arc quenching mechanism includes high voltage high speed (HVHS) switching circuit arrangements that each incorporate a HVHS switch added in series between each high voltage supply and its respective high voltage electrode associated with the ion source for quickly extinguishing the harmful arcs.

In one example, the arcs that form in these areas have a tendency to substantially discharge high voltage capacitors within power supplies, such as HV power supplies, for the ion source or extraction electrode supply voltage ($V_{ext}$), or for the suppression electrode supply voltage ($V_{sup}$). Consequently, the ion beam current is dramatically affected by these "glitches" in the ion beam current ($I_{beam}$), and accordingly takes considerable time thereafter for the supply voltages and beam current $I_{beam}$ to recover.

An arc detection circuit is discussed that quantifies the electrode current as a digital current signal that can be analyzed with respect to multiple detection parameters by digital processing components to detect arcs that occur in different circumstances and at different positions in the ion implantation system. The arc detection circuit generates an arc detection signal that triggers the arc quenching circuit to shorten the duration of the arc, thereby mitigating the duration of erratic ion beam current, and minimizing the non-uniformity of ion implantations, for example.

Further, it is desirable to include arc quenching mechanisms on HV supplies that power electrodes that act on the ion beam downstream of scanning of the ion beam. The current supplied to the downstream electrodes varies significantly depending on the position of the ion beam within a process sweep across the wafer. For example, a fixed threshold would not be effective to detect arcing during a central portion of the process sweep because the normal current levels at this position are so much lower than the normal current levels when the ion beam is at the edges of the wafer.

The arc detection circuit of the present invention detects arcs using dynamic detection parameters (e.g., current or voltage thresholds) that can be adapted to many process recipes, can be varied based on recently experienced current levels, and can be varied based on position in the process sweep of the beam. Threshold parameter values for triggering the arc quenching mechanism, for example, can be selectively and/or dynamically determined based on various parameters, operating conditions, recipes, loading conditions, and so on of the ion implantation system. Further, characteristics of the arc quenching mechanism, such as quench time and stabilization time, may also be varied as a function of the various parameters. In this manner, the disclosed arc detection circuit and method of the present disclosure effectively mitigates ion beam disruption and speeds beam current recovery in a wide variety of applications and conditions.

The arc detection circuit of the present invention quantifies, as a digital current signal, a sensed electrode current flowing into or out of an electrode in an ion implantation system. The electrode current, for example, is current that flows into or out of an HV electrode and includes a combination of the portion of the ion beam current striking the electrode and the power supply current provided to the electrode to maintain a set bias voltage. The digital representation of the electrode current can be quickly analyzed by digital processing components (e.g., a processor, a field programmable gate array (FPGA), a complex logic programmable device (CPLD), a combination of components, and so on) to detect symptoms of arcing at the HV electrodes. The term FPGA may be used as a shorthand to refer to either an FPGA or a CPLD, or the like. The digital processing components may include an FPGA that makes real time decisions regarding triggering a quench operation and an ARM or other processor configured to store and/or manipulate the stored digital signal to determine threshold parameter values, and so on.

A range of threshold values for the electrode current signal as a function of ion beam position in a process sweep may be computed by the arc detection circuit based on electrode current levels experienced during prior scans. The arc detection circuit stores multiple arc detection parameter values that can be used individually, or in combination, to detect an arcing condition. The arc detection parameters or values, for example, are dynamic and can be changed according to process recipe or change(s) in operating conditions.

In accordance with one example, a method of detecting an arc in an ion implantation system is provided. The method includes receiving a sensing current indicative of a current being supplied to one or more electrodes in the ion implantation system and quantifying the sensing current to generate a digital current signal. Digital processing circuitry, for example, is used to analyze the digital current signal to determine whether the digital current signal meets a threshold parameter value. In response to the digital current signal meeting the threshold parameter value, a detection signal is provided to a trigger control circuit that activates an arc quenching mechanism.

In one example, an arc detection circuit is provided for detecting an arc in an ion implantation system. The arc detection circuit includes an analysis circuit and an analog-to-digital converter (ADC). The ADC is configured to convert a sensing current indicative of a current being supplied to an electrode in the ion implantation system to a digital current signal that quantifies the sensing current. The analysis circuit is configured to analyze the digital current signal to determine if the digital current signal meets a threshold parameter value and, in response to the digital current signal meeting the threshold parameter value, provide an arc detection signal to a trigger control circuit that activates an arc quenching mechanism.

In accordance with another example, an analysis circuit is provided that includes hardware processing components configured to compare a digital current signal to a threshold parameter value, and in response to the digital current signal meeting the threshold parameter value, provide an arc detection signal to a trigger control circuit that activates an arc quenching mechanism. The analysis circuit also includes a processor configured to dynamically determine the threshold parameter value.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following

DETAILED DESCRIPTION OF THE INVENTION

Figure 1:
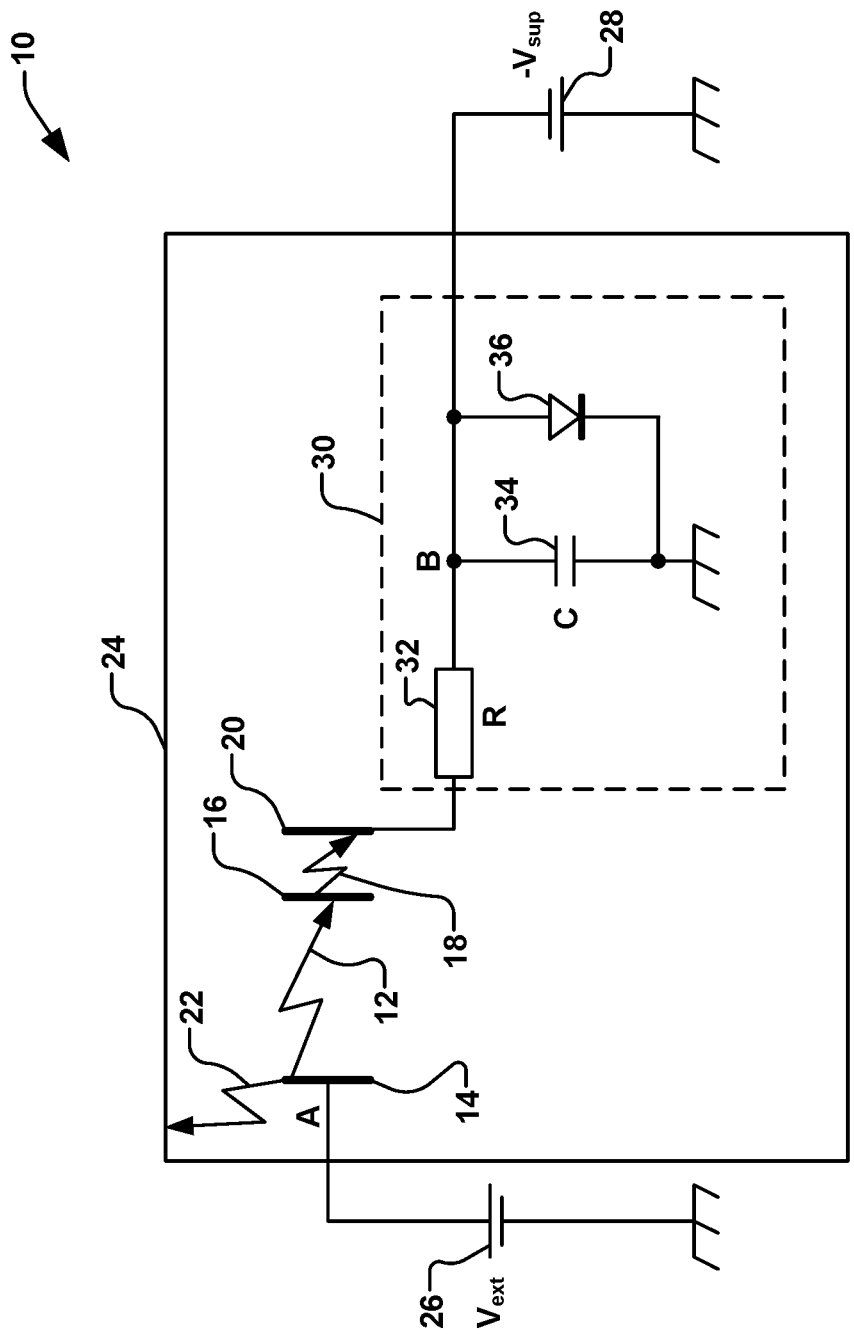
FIG. 1 is a simplified schematic diagram of arcing occurring at an ion source as well as an exemplary suppression electrode high voltage supply circuit having a conventional arc suppression circuit such as may be used in an ion implantation system.

The present invention will now be described with reference to the drawings wherein like reference numerals are used to refer to like elements throughout. The illustrations and following descriptions are exemplary in nature, and not limiting. Thus, it will be appreciated that variants of the illustrated systems and methods and other such implementations apart from those illustrated herein are deemed as falling within the scope of the present invention and the appended claims. As utilized herein, terms "module", "component," "system," "circuit," "element," "slice," "circuitry," and the like are intended to refer to a set of one or more electronic components, a computer-related entity, hardware, software (e.g., in execution), and/or firmware. For example, circuitry, circuit or a similar term can be a processor, a field programmable gate array (FPGA), a process running on a processor, a controller, an object, an executable program, a storage device, and/or a computer with a processing device. By way of illustration, an application running on a server and the server can also be circuitry. One or more circuits can reside within the same circuitry, and circuitry can be localized on one computer and/or distributed between two or more computers. A set of elements or a set of other circuits can be described herein, in which the term "set" can be interpreted as "one or more."

An arc detection circuit is described herein that includes an analog-to-digital converter (ADC) and an analysis circuit. The ADC samples and converts the electrode current into a digital current signal that is analyzed by the analysis circuit with respect to multiple arc detection parameters including quench time, stabilization time, arc duration time, and threshold current or voltage.

An arc quenching circuit, for example, includes high voltage high speed (HVHS) switching circuits comprising HVHS switches (e.g., 65 KV @ 2 MHz MOSFET switches) coupled in series with the high voltage supplies to the suppression and/or extraction electrodes, or ground electrodes, to extinguish the harmful arcs. When such HV arcs occur, the high voltage capacitors of such HV power supplies may be substantially discharged. This deep discharge dramatically affects the ion beam current and requires considerable time thereafter for the power supply voltages and the ion beam current $I_{beam}$ to recover.

The high voltage switches in the arc quenching circuit are controlled by the arc detection circuit, which detects current or voltage changes in the HV supplies to the electrodes as are associated with the formation of an arc at one of the electrodes. The arc quenching circuit comprises one or more protection circuits for the HV switches to absorb excess energy from reactive components surrounding the HVHS switches and clamp any over-voltages from the HVHS switches. The protection circuits may be connected in parallel with and/or in series with a respective HVHS switch.

Although the arc detection circuit of the present invention is illustrated and described in the context of ion sources and ion implantation systems, it is to be appreciated that such arc detection circuits may also be utilized in other applications requiring HV and high speed arc quenching, such as x-ray equipment, accelerators, or other ion source applications, for example. In this manner, unwanted arc shorting of high voltage supplies may be detected before the high voltage power supply has been significantly discharged and has had a chance to affect the output of related systems (e.g., the ion beam of an ion implantation system).

Figure 2A:
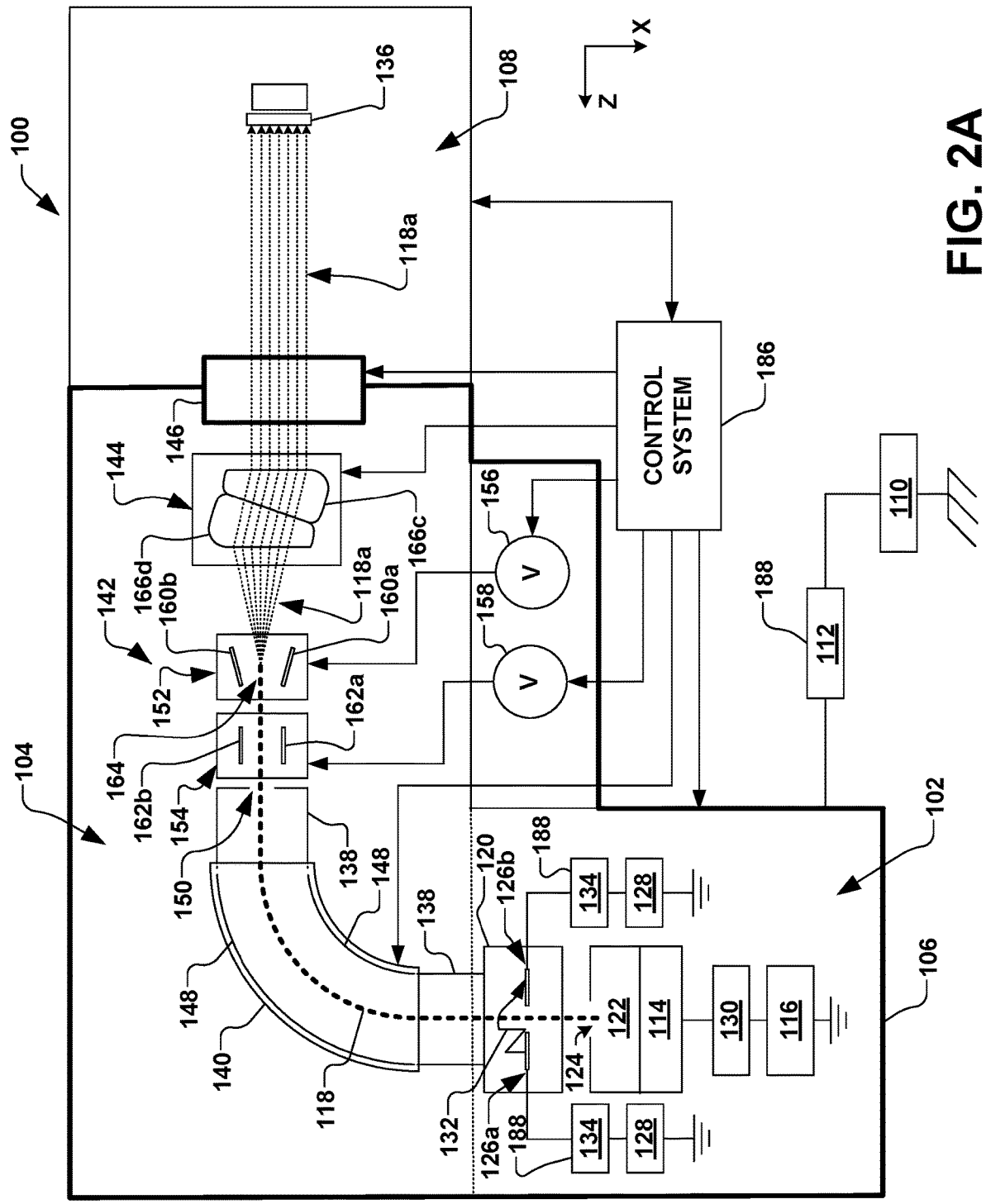
FIG. 2A is a simplified block diagram of an exemplary ion implantation system such as may utilize the arc detection circuit of the present invention.

Referring now to the Figures, FIG. 2A illustrates an exemplary ion implantation system 100 wherein ion beam energy can be selectively varied and/or controlled as described herein. The system 100 has an injector 102 and a beamline assembly 104 disposed in a terminal 106 and an end station 108. The terminal 106 includes a terminal bias high voltage power supply 110 that biases components within the terminal with respect to ground. In accordance with one exemplary aspect, a terminal arc quenching circuit 112 is associated with the terminal 106. Various details of the terminal arc quenching circuit 112 will be discussed further, infra.

In particular, the terminal arc quenching circuit 112, for example, is used to detect and quench arcing that occurs between the terminal 106 and ground sources. These ground sources can include electrically isolated exhaust lines (not shown) for vacuum leaving the terminal 106, or other components which can become coated with various films. For example, when the electrically isolated exhaust lines can no longer insulate high voltage stresses due to the film coating, the lines can arc and ablate material until sufficient resistance is restored, or the implanter is serviced. Other arcing sources between the terminal 106 and ground can include a terminal isolation bushing (not shown) which connects the terminal to the end station 108, and can become coated until insufficiently insulated. Arcing from the terminal 106 to ground can also occur through deionized water and water lines (not shown) used for cooling if the water is insufficiently deionized or becomes contaminated which further reduces the electrical isolation until arcing becomes possible.

The injector 102, for example, includes an ion source 114 powered by a extraction high voltage power supply (HVPS) 116 that produces and directs an ion beam 118 to the beamline assembly 104. For example, the source HVPS 116 biases a gas box (not shown) and the ion source 114. In this regard, the ion source 114 generates charged ions that are extracted from the ion source via an extraction assembly 120 and formed into the ion beam 118 that is subsequently directed along a beam path in the beamline assembly 104 to the end station 108. To generate the ions, a dopant material (not shown) to be ionized is provided within a generation chamber 122 of the ion source 114. The dopant material, for example, can be fed into the generation chamber 122 from a gas source (not shown). It will be appreciated that any number of suitable mechanisms (not shown) can be used to excite free electrons within ion generation chamber 122, such as RF or microwave excitation sources, electron beam injection sources, electromagnetic sources and/or a cathode which creates an arc discharge within the chamber. The excited electrons collide with the dopant gas molecules, thereby generating ions. Generally, positive ions are generated in the ion generation chamber 122; although the disclosure herein is also applicable to systems wherein negative ions are generated.

The ions are controllably extracted through a slit 124 in the chamber 122 by the ion extraction assembly 120, wherein the ion extraction assembly comprises a plurality of extraction suppression electrodes 126a, 126b. The ion extraction assembly 120, for example, can include single or dual extraction suppression electrodes 126. One or more extraction suppression power supplies 128, for example, bias the respective extraction suppression electrodes 126a, 126b for accelerating the ions from the generation chamber 122. Due to the high voltages being supplied by the source HVPS 116, arcing may occur between the ion source 114 and the surrounding environment. A source arc quenching circuit 130 is used to quench such an arc by interrupting the power from the extraction HVPS 116 to the ion source 114. The present disclosure appreciates that arcing 132 may sometimes occur between the electrodes 126a, 126b or between one of the electrodes and another component or the vacuum chamber housing (not shown) surrounding the electrodes. An extraction suppression arc quenching circuit 134 is used to quench such an arc by interrupting the power from the extraction suppression HVPS 128 to the electrode 126a and/or 126b.

It can be appreciated that since the ion beam 118 comprises like-charged particles, the ion beam may have a tendency to expand radially outwardly, or beam "blow up", as the like-charged particles repel one another within the ion beam. It can also be appreciated that this phenomenon of beam blow-up can be exacerbated in low energy, high current beams, where many like-charged particles are moving in the same direction relatively slowly, and wherein there is an abundance of repulsive forces among the particles, but little particle momentum to keep the particles moving in the direction of the beam path.

Accordingly, the extraction assembly 120 is generally configured such that the ion beam 118 is extracted at a high energy so that the ion beam does not blow up (e.g., so that the particles have sufficient momentum to overcome repulsive forces that can lead to beam blow up). Moreover, it is generally advantageous to transfer the beam 118 at a relatively high energy throughout the system, wherein this energy can be reduced as desired just prior to implantation of the ions into the workpiece 136 to promote beam containment. It can also be advantageous to generate and transport molecular or cluster ions which can be transported at a relatively high energy but are implanted with a lower equivalent energy, since the energy of the molecule or cluster is divided amongst the dopant atoms of the molecule.

Figure 2B:
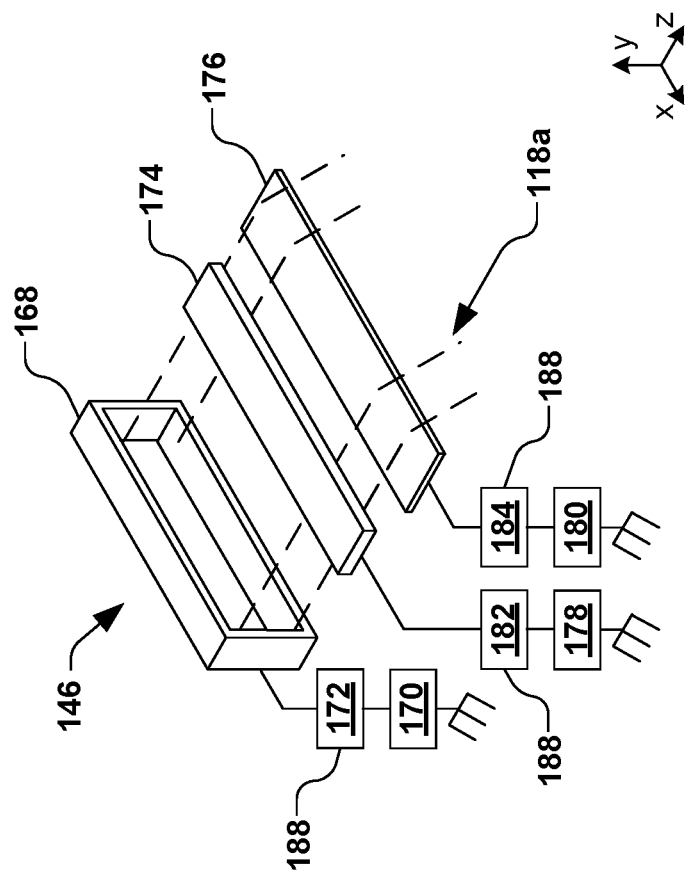
FIG. 2B is a simplified perspective view of an exemplary angular energy filter system such as may utilize the arc detection circuit of the present invention.

The beamline assembly 104 includes a beamguide 138, a mass analyzer 140, the scanning system 142, a parallelizer or corrector 144, and one or more angular energy filters 146 (shown in detail in FIG. 2B). The mass analyzer 140 of FIG. 2A is configured to have approximately a ninety degree angle and comprises one or more magnets (not shown) that serve to establish a (dipole) magnetic field therein. While a ninety degree angle is illustrated in FIG. 2A, other mass analyzers employ angles including 110 degrees, 130 degrees, or other angles. As the ion beam 118 enters the mass analyzer 140, it is correspondingly bent by the magnetic field such that desired ions are transported down the beam path, while ions of an inappropriate charge-to-mass ratio are rejected. More particularly, ions having too great or too small a charge-to-mass ratio are deflected either insufficiently or exceedingly so as to be steered into side walls 148 of the mass analyzer 140 so that the mass analyzer allows those ions in the beam 118 that have the desired charge-to-mass ratio to pass there-through and exit through a resolving aperture 150.

The scanning system 142 comprises a scanning element 152 and a focusing and/or steering element 154. In the exemplary scanning system 142, respective power supplies 156, 158 are operatively coupled to a scanning element 152 and a focusing and steering element 154, and more particularly to respective electrodes 160a, 160b and 162c, 162d located therein. The focusing and steering element 154 receives the mass analyzed ion beam 118 having a relatively narrow profile (e.g., a "pencil" beam in the illustrated system 100), wherein a voltage applied by the power supply 158 to the plates 162a and 162b operates to focus and steer the ion beam to an optimal point, preferably a scan vertex 164, of the scanning element 152. A voltage waveform applied by the power supply 156 to the scanner plates 160a and 160b then scans the beam 118 back and forth to spread the beam 118 out into an elongated "ribbon" beam (e.g., a scanned beam 118a), having a width that may be at least as wide as or wider than the workpieces of interest. It will be appreciated that the scan vertex 164 can be defined as the point in the optical path from which each beamlet or scanned part of the ribbon beam 118a appears to originate after having been scanned by the scanning element 152.

It will be understood that an ion implantation system of the type described herein may employ different types of scanning systems. For example, electrostatic systems or magnetic systems could be employed in the present invention. One embodiment of an electrostatic scanning system includes a power supply coupled to scanner plates or electrodes 160a and 160b, where the scanner 152 provides the scanned beam 118a. The scanner 152 receives the mass analyzed ion beam 118 having a relatively narrow profile (e.g., a "pencil" beam in the illustrated system), and a voltage waveform applied by the power supply 156 to the scanner plates 160a and 160b operates to scan the beam back and forth in the X direction (the scan direction) to spread the beam out into an elongated "ribbon" beam (e.g., a scanned beam), having an effective X-direction width that may be at least as wide as or wider than the workpieces of interest. Similarly, in a magnetic scanning system, a high current supply is connected to the coils of an electromagnet. The magnetic field is adjusted to scan the beam. For purposes of this disclosure, all different types of scanning systems are contemplated, and the electrostatic system is used for illustration. The scanned beam 118*a* is then passed through the parallelizer 144 that directs the beam toward the end station 108 generally parallel to the Z direction (e.g., generally perpendicular to the workpiece surface). While a magnetic parallelizer 144 is illustrated in FIG. 2A, in other ion implantation systems, an electrostatic parallelizing lens electrode is used. In such systems, an arc quenching circuit (not shown) similar to those discussed herein may be installed for use in quenching arcs occurring on parallelizing electrodes 166*c*, 166*d* of the parallelizer 144.

Referring to FIG. 2B, the angular energy filter 146, for example, includes an electrically biased terminal suppression aperture 168 that suppresses electrons from back streaming to the negatively biased terminal 106 of FIG. 2A. More particularly, ions having too great or too small potential are deflected either insufficiently or exceedingly so as to be steered into top and bottom walls (not shown) of the angular energy filter exit aperture so that only those ions in the beam having the desired potential pass through the aperture and exit. The aperture 168 of FIG. 2B is biased by a terminal suppression HVPS 170 and arcing from the aperture 168 is detected and quenched by arc quenching circuit 172. A top plate electrode 174 and a bottom plate electrode 176 set up an electric field that filters out undesired ion beam potentials from the scanned beam 118*a*. The electrodes 174, 176 are biased by a top plate HVPS 178 and a bottom plate HVPS 180, respectively. An arc quenching circuit 182 is used to detect and quench arcing on the top plate electrode 174 and an arch quenching circuit 184 is used to detect and quench arcing on the bottom plate electrode 176. In one example, a single circuit board may embody both the arc quenching circuit 182 and the arc quenching circuit 184.

Control of any components described above may be accomplished via an ion implantation system control system 186 illustrated in FIG. 2A). As will be described in more detail infra, the arc quenching circuits 112, 130, 134, 172, 182, 184 of FIGS. 2A-2B (referred to generally as an arc quenching circuit 188), for example, are controlled or triggered by a respective arc detection circuit (not shown), which senses the current flowing to the ion source 114 (in the case of arc quenching circuit 130) or to HV electrodes (in the case of arc quenching circuits 112, 134, 172, 182, 184) and activates an arc quenching mechanism (not shown) in response to a threshold parameter value being met. The arc quenching circuits 188 function in a similar manner while using different threshold parameter value that is aligned with the expected electrode currents at the given location. For example, the electrode currents monitored by arc quenching circuits 130 and 134 of FIG. 2A, for example, may be nearly DC in nature, while the electrode currents monitored by arc quenching circuits 112, 172, 182, 184, which are downstream of a scanning system 142, vary significantly as a function of the ion beam's position in the process sweep of the wafer. Thus, arc quenching circuits 112, 172, 182, 184 may use threshold parameter value that varies as a function of position within the beam sweep (e.g., determined by elapsed time since the beginning of the sweep) while arc quenching circuits 130 and 134 may use a threshold parameter value that does not vary as a function of beam position. While in this description, six arc detection circuits are used to detect arcing in six different HV electrodes, the disclosed arc detection circuit may be applied to any HV electrode prone to arcing, including electrodes with lesser voltage supplies associated with smaller focusing and suppression electrodes.

Figure 3:
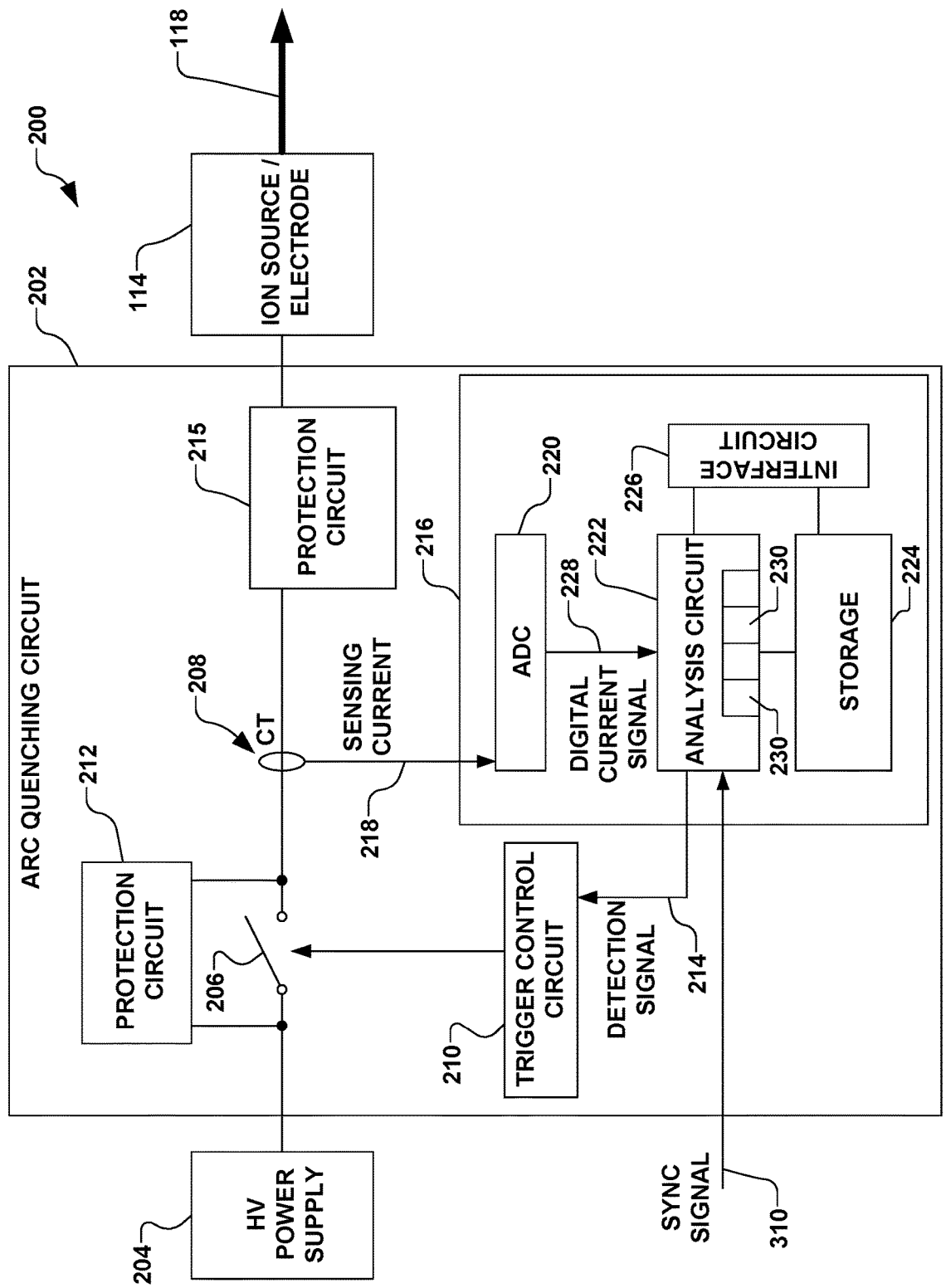
FIG. 3 is a schematic block diagram illustrating components of an arc detection circuit according to one or more aspects of the present invention to quench an arc associated with an ion source of the ion implantation system.

Referring now to FIG. 3, an example ion implantation system 200 is illustrated that includes an exemplary arc quenching circuit 202 for an HVPS biasing an ion source 114. The system 200 includes an HVPS 204 (e.g., the source HVPS 116 of FIG. 2A), a high voltage high speed HVHS switch 206, and a current transformer (CT) 208 for detecting the current flowing from the supply 204 to the ion source 114 for producing a quantity of ions that can be extracted in the form of an ion beam 118. A trigger control circuit 210 activates a quenching mechanism (e.g., opens the HVHS switch 206) when a detection signal 214 provided by an arc detection circuit 216 indicates that certain threshold parameter value for the detected current have been met. Other arc quenching mechanisms other than the HVHS switch 206 may be used such as other types of switches or activating a power supply feature that interrupts flow of power from the supply. While the arc quenching circuit 202 is illustrated as quenching arcs associated with a HVPS 204, the arc quenching circuit 202 may also be applied to HV electrodes used for ion beam focusing/shaping or providing suppression. The HVHS switch 206 is protected by parallel and series protection circuits 212 and 215, respectively, to absorb energy from reactive components surrounding the switch 206 and protect the switch from over-voltage damage. The protection circuits 212 and 215 also protect the switch 206 and other components of the ion implantation system, by dampening any ringing induced by switching transients and the reactive components external to the HVHS switch 206. The arc quenching circuit 202 may be used in any ion implantation system, or other such applications as may use a high voltage supply subject to arc discharges at the output of the supply.

The arc detection circuit 216 receives or monitors analog sensing current 218 that is generated in the secondary winding of the CT 208 and generates the detection signal 214 for the trigger control circuit 210 when the sensing current indicates that an arc is occurring. The arc detection circuit 216 includes an analog-to-digital converter (ADC) 220, an analysis circuit 222, storage media 224, and interface circuit 226. The ADC 220 oversamples and quantifies the sensing current to generate a digital current signal 228 comprising a series of digital current values. Due to the importance of quickly quenching arcs, the ADC 220 may be a low latency ADC that has been optimized for reducing the time required to quantify a sample of the sensing current as a digital current signal value. In one example, the ADC 220 is a 12 bit low latency ADC that is capable of sampling the sensing current at approximately 60-125 mega samples per second (msps). An ADC capable of sampling the sensing current at rates as low as about 40 msps can be used to fully characterize the signal produced by the current transformer 208. However, adequate quenching performance may be obtained using an ADC 220 that senses as slowly as 250 ksps.

The analysis circuit 222 is a digital processing circuit, meaning that the circuit 222 operates in the digital domain on the digital current signal 228 using digital components. The analysis circuit 222 is configured to analyze the digital current signal 228 to determine whether applicable threshold parameter value have been met and to generate and provide the detection signal 214 to the trigger control circuitry 210 when the criteria is met. The analysis circuit 222 is configured to determine the applicable threshold parameter value based on an operating condition of the ion implantation system such as, for example, a process recipe currently in use by the system 200 or digital current signals 228 received during recent scans. The analysis circuit 222 retrieves threshold parameter values for the process recipe from the storage media 224. The interface circuit 226 provides a means for a user to store threshold parameter values as mapped to different process recipes in the storage media 224.

In addition to the threshold on the magnitude of the digital current signal, the analysis circuit 222 may also dynamically determine other threshold parameter values. Example threshold parameter values include a current threshold, a minimum arc duration, a quench time, and a stabilize time. The current threshold defines a limit on the magnitude of the digital current signal 228. For example, if the current threshold is 200 mA, then if the current signal 228 exceeds +200 mA or is less than −200 mA, the current threshold has been exceeded by the digital current signal. In some examples, different magnitudes may be used for positive values of the current threshold and negative values of the current threshold.

The minimum arc duration is an amount of time that the digital current signal 228 must exceed the threshold for the analysis circuit 222 to determine that an arc is occurring and generate the detection signal 214. The minimum arc detection time is used to try to eliminate false detection signals that might be generated due to noise in the digital current signal 228 or transients in the sensing current 218 that are unrelated to arcing. The quench time is the duration that the trigger control circuit 210 opens the HVHS 206 to more quickly extinguish an arc that might otherwise sustain itself longer through the lowered resistance path until the voltage has been sufficiently discharged to naturally extinguish. The stabilize time is the amount of time that must elapse after the HVHS 206 is closed before the digital current signal 228 is analyzed by the analysis circuit 222 with respect to the threshold parameter value. This allows the electrode and beam to recover from the switching event before determining whether the arcing is still occurring.

Any or all of these threshold parameter values of the arc detection circuit 216 may be selected or vary in a dynamic manner depending on many different operating conditions, including the process recipe in use. Parameters in a process recipe that may affect the threshold parameter values include ion beam potential, electrode potential, ion beam current, beam scanning frequency, spot beam shape, and any other process configuration parameters that participate in the loading measured by the CT 208. The analysis circuit 222 may be configured to automatically scale the threshold parameter values that are stored for a given process recipe in response to any of these parameters being changed.

In one example, the analysis circuit 222 is embodied as a field programmable gate array (FPGA) that includes a number of registers 230 that may store threshold parameter values retrieved from the storage media 224. The FPGA advantageously provides parallel processing capability to quickly compare the values of the digital current signal 228 to the contents of the registers 230, which correspond to the threshold parameter values stored in the registers.

Figure 4:
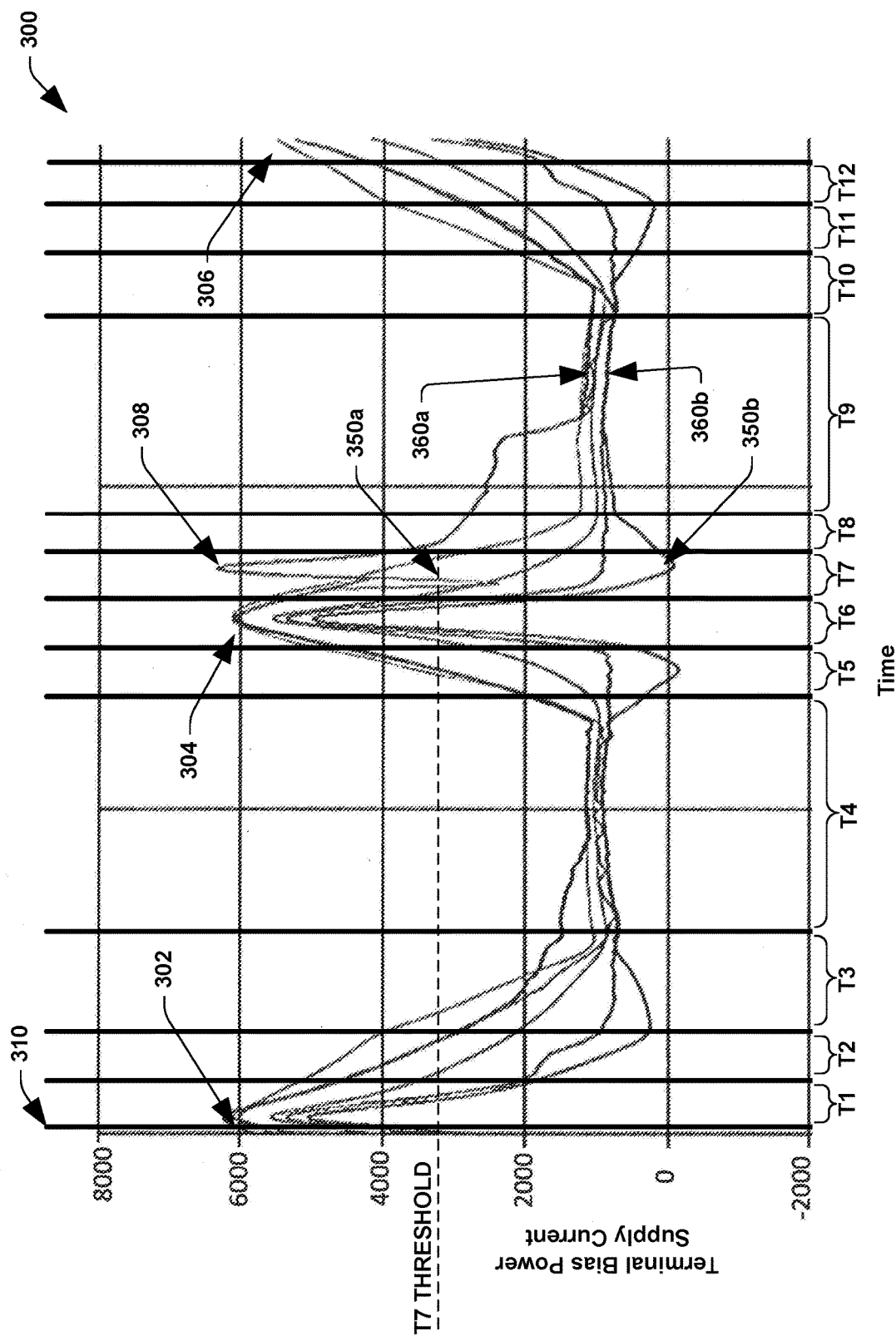
FIG. 4 is a plot of terminal bias power supply current versus time indicating minimum and maximum threshold beam currents as well as a beam current under analysis.

While constant threshold parameter values may be appropriate for electrodes that experience a near DC load (e.g., electrodes upstream of the scanning system), threshold parameter values that vary during each process sweep may be better suited for electrodes (e.g., electrodes downstream of the scanning system) that experience a more dynamic load. The analysis circuit 222 is thus configured to store several values for the current threshold, each mapped to a different range of positions in the process sweep. FIG. 4 illustrates power supply current from the terminal bias HVPS 110 of FIG. 2A for biasing the terminal 106 to a fixed voltage as a function of time over the course of 656 scans of a wafer. A left side peak 302 of FIG. 4 corresponds to when the ion beam is at the leftmost position of the wafer, a middle peak 304 corresponds to when the ion beam is at the rightmost position of the wafer, and the right side peak 306 (which continues back to left side peak 302) corresponds to when the ion beam is back at the leftmost position of the wafer. It can be seen that when the ion beam is near the edges of the wafer, the loading becomes more dynamic due to the proximity of other implantation system components (e.g., mounting hardware, and so on).

FIG. 4 illustrates that the use of a fixed threshold that is high enough to prevent triggering at the wafer edges for the arc quenching circuit 188 of FIG. 2A will be ineffective for detecting an abnormal current when the ion beam is in the middle of the wafer. Therefore, a different current threshold is stored for each of several increments of time T1, T2, T3 . . . T12 shown in FIG. 4 that occur starting at the beginning of a process sweep (i.e., each single scan of the wafer). While twelve time increments are shown, any number of increments, up to one increment per each digital current signal sample, may be used. For example, an arc event 308 may not be detected by the analysis circuit 222 of FIG. 3 when using a current threshold set high enough to avoid triggering on the current values at the wafer edges. However the arc event 308 of FIG. 4 could be detected by the analysis circuit using a lower current threshold (e.g., the T7 threshold indicated in FIG. 4) when the ion beam is at a location nearer the center of the wafer. To facilitate the use of different current thresholds at different ion beam positions, a synchronization signal 310 is sent to each arc detection circuit 216 of FIG. 3 to indicate the beginning of each process sweep. This synchronization signal may be provided by the ion implantation system control system (186 in FIG. 2A).

The use of digital circuitry and storage media for analyzing the digital current signal data for multiple process sweeps also provides the capability of statistically modeling the digital current signal during ion implantation system operation to dynamically adjust or determine the current threshold values. For example, a default current threshold value may be stored for a given process recipe. During operation, digital current signal values for each scan may be collected and analyzed to determine a range of values that can be expected to occur in the absence of an arc in each wafer position or increment of time since the sync signal. In FIG. 4, for example, points 350a, 350b correspond to the +/−3σ range of current values for the last 656 scans during time increment T7. Points 360a, 360b correspond to the +/−3σ values for the last 656 scans during time increment T9. These statistically modeled values, for example, which will change as electrodes wear, temperatures drift, and so on, can be used by the analysis circuit 222 of FIG. 3 to dynamically adjust the current threshold values for the different time increments. An example threshold current, based on statistical modeling, is illustrated in FIG. 4. In this manner the analysis circuit can adjust the threshold parameter values dynamically based on a statistical model of the digital current signal. When the process recipe changes, the analysis circuit may store the most recent current threshold values in the storage media for access the next time the process recipe is in use or the default values may remain in the storage media for use the next time the process recipe is in execution.

In another example, the threshold parameter values associated with a process recipe may be scaled based on some ratio/function of magnitude of the digital current signal, such as the peak or average of the digital current signal detected during an arcing event. For example, a 200 mA arc (which corresponds to some scaled voltage at the ADC 220 of FIG. 2) may scale down a 200 μs quench time stored based on a 400 mA digital current signal magnitude to 150 μs for a 200 mA digital current signal magnitude or up in an analogous manner for a digital current signal magnitude greater than 400 mA. Other threshold parameter values, such as the stabilize time may also be scaled.

Returning to FIG. 3, while a single arc quenching circuit 202 is illustrated, it is to be understood that multiple arc quenching circuits may be disposed at different locations and in association with different electrodes in an ion implantation system. Advantageously, each of the arc quenching circuits may detect arcs based on different threshold parameter values that are selected based on an expected electrode current.

Figure 5:
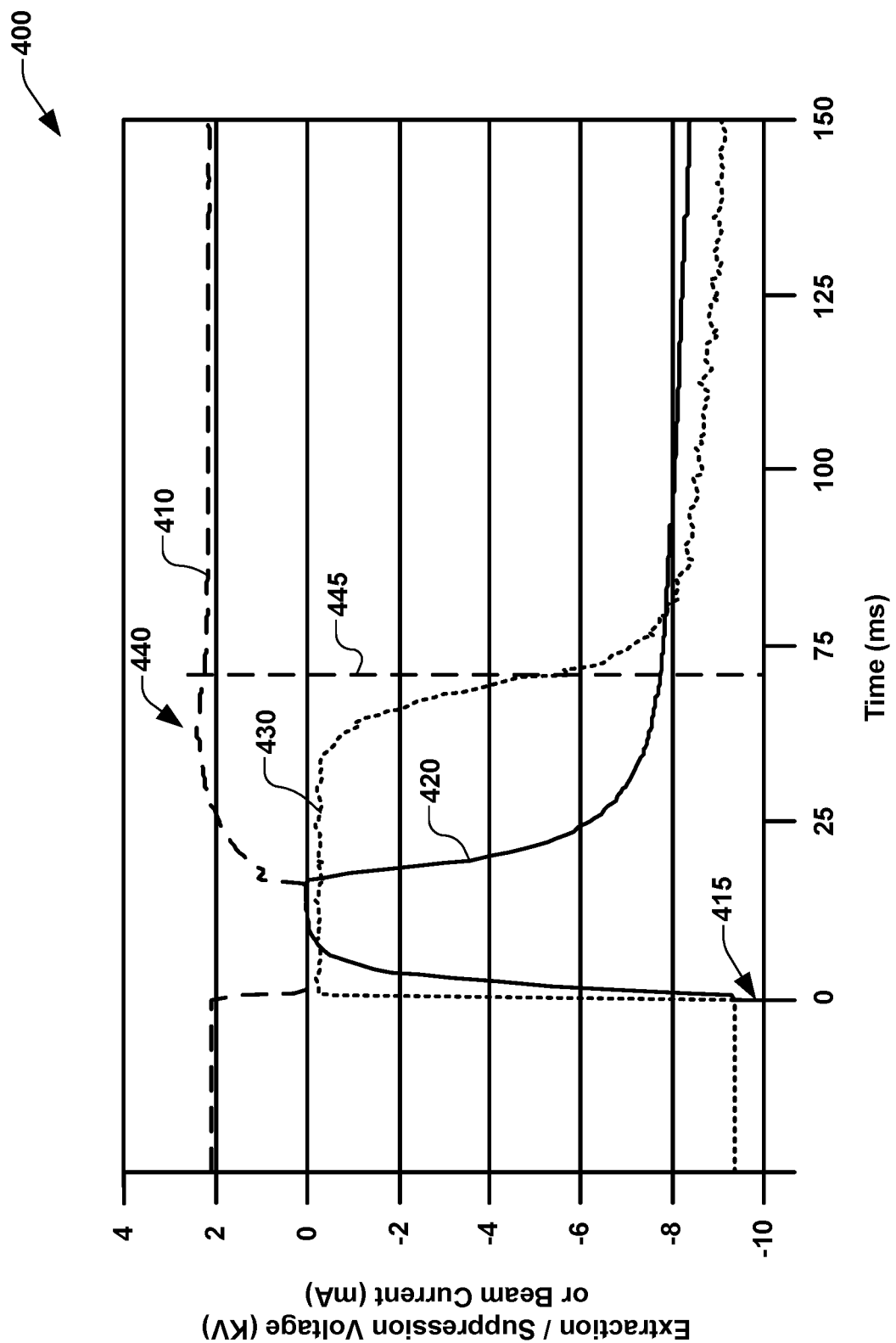
FIG. 5 is a plot of the change in the beam current and the extraction and suppression voltages over time within an ion implantation system during arcing of the high voltage electrodes of the ion implantation system of FIG. 2A.

Turning now to FIG. 5, a plot 400 of the change in the beam current which results when an arc occurs in the high voltage extraction and suppression voltages of an ion implantation system similar to the ion implantation system of FIG. 2A is illustrated.

The plot 400 illustrates that an arc discharges extraction voltage 410 from about 2.2 KV to near 0V at a time 415 at about 0 ms. At about the same time, the suppression voltage 420 drops from about −9.3 KV to near 0V while the beam current $I_{beam}$ 430 drops to near 0 mA. As the extraction and suppression voltages 410, and 420, respectively, fall to near 0 volts, the arc self extinguishes, thereby allowing these voltages to recharge toward their original voltage levels. As shown at 440, the extraction voltage 410 overshoots this original voltage, and detrimentally delays the recovery of beam current $I_{beam}$ 430 until time 445 (at about 67 ms) wherein extraction voltage 410 has generally recovered. It may be observed from plot 400 that extraction voltage changes have a relatively large and lasting impact on beam current. Thus, FIG. 5 suggests that it may be beneficial to quickly open the high voltage current paths between the electrodes for the ion beam and the high voltage supplies for the electrodes before the HV supplies have had a chance to significantly discharge. The arc quenching circuit of the present invention accomplishes this goal.

Figure 6:
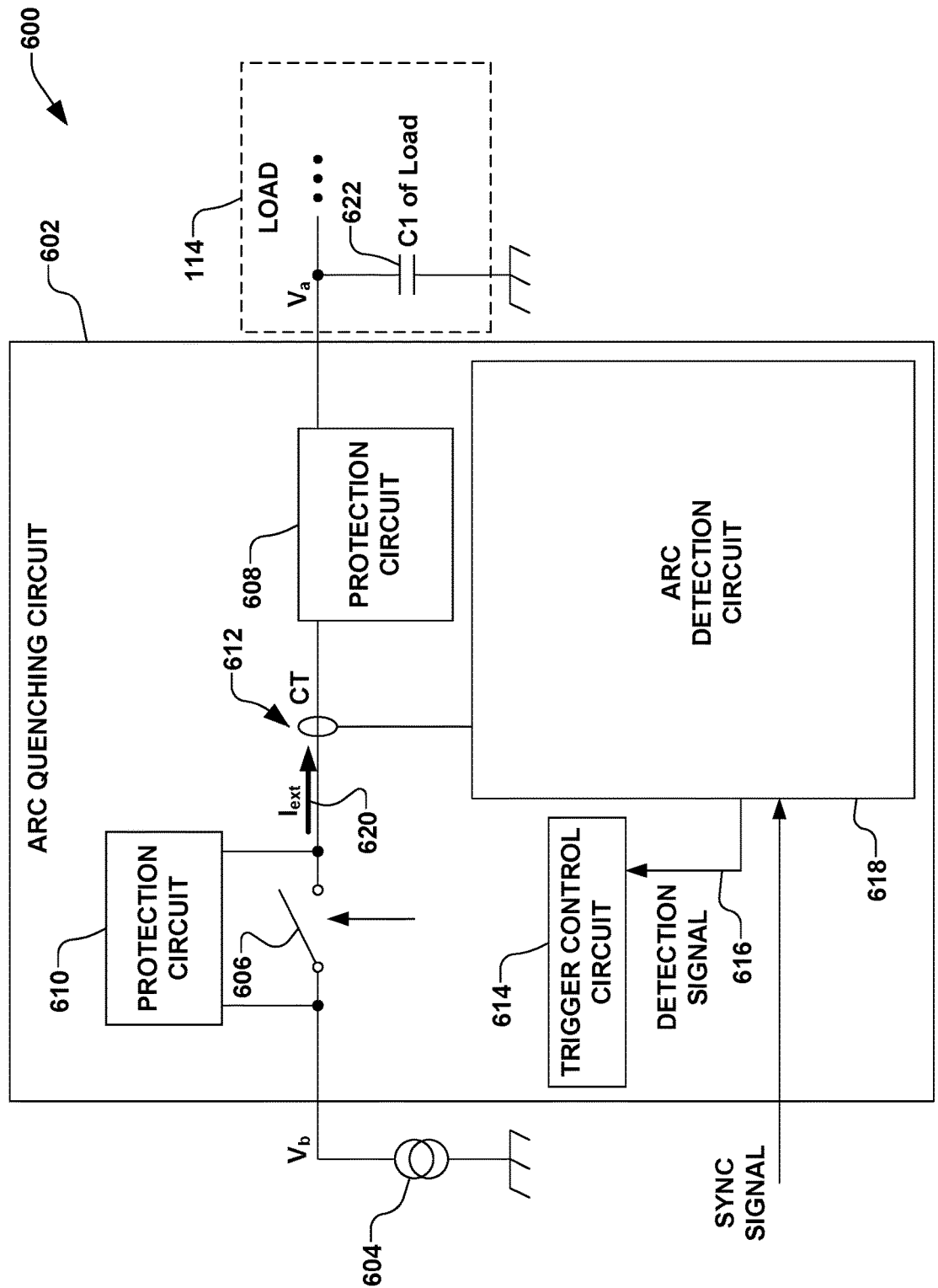
FIG. 6 is a simplified block diagram of an exemplary arc quenching circuit utilized in association with the high voltage supply of an ion source such as may be used in an ion implantation system in accordance with the present invention.

FIG. 6 illustrates an exemplary an ion implantation system 600 utilizing an exemplary arc quenching circuit 602 in association with a high voltage supply of an ion source. in accordance with various aspects of the present invention. For example, arc quenching circuit 602 comprises a high voltage supply ($V_b$) 604 (e.g., a high voltage positive supply) and an HVHS switch 606 (e.g., a series stack of MOSFET transistors) connected in series with a switch protection circuit 608, which drives a load (e.g., an ion source 114). The HVHS switch 606 is also connected in parallel with a parallel protection circuit 610 which protects the switch 606 from reactive over-voltages, for example. Arc quenching circuit 602, further comprises a current transformer CT 612 that detects the current in the supply 604 to the ion source 114, used for example, for producing a quantity of ions that can be extracted in the form of an ion beam (e.g., ion beam 118 of FIG. 2A).

Circuit 600 also includes a trigger control circuit 614 controlled by a detection signal 616 generated by an arc detection circuit 618. In the context of the present invention, the arc protection circuit 618 may also be used in association with the HVHS switch 606 to protect the HVHS switch from damage. If a current surge indicative of an arc occurs in supply current ($T_{ext}$) 620, then the arc detection circuit 618 provides the detection signal 616 to the trigger control circuit 614 which opens the HVHS switch 606 to quench the arc. A capacitance C1 at point 622 within the load (e.g., ion source 114), and the voltage at the load ($V_a$) is therefore isolated by HVHS switch 606 from the voltage $V_b$ of the high voltage supply 604. Thus, $V_a$ at C1 of the load may discharge due to the occurrence of an arc, but the supply voltage $V_b$ will remain generally charged at voltage due to isolation by the HVHS switch 606.

Again, the HVHS switch 606 is protected by series and parallel protection circuits 608 and 610, respectively, to absorb energy from reactive components external to the switch 606 and therefore protect the switch from over-voltage damage. The arc quenching circuit 602 of the present invention may be used in any ion implantation system, or other such applications as may use a high voltage supply subject to arc discharges at the output of the supply.

Figure 7:
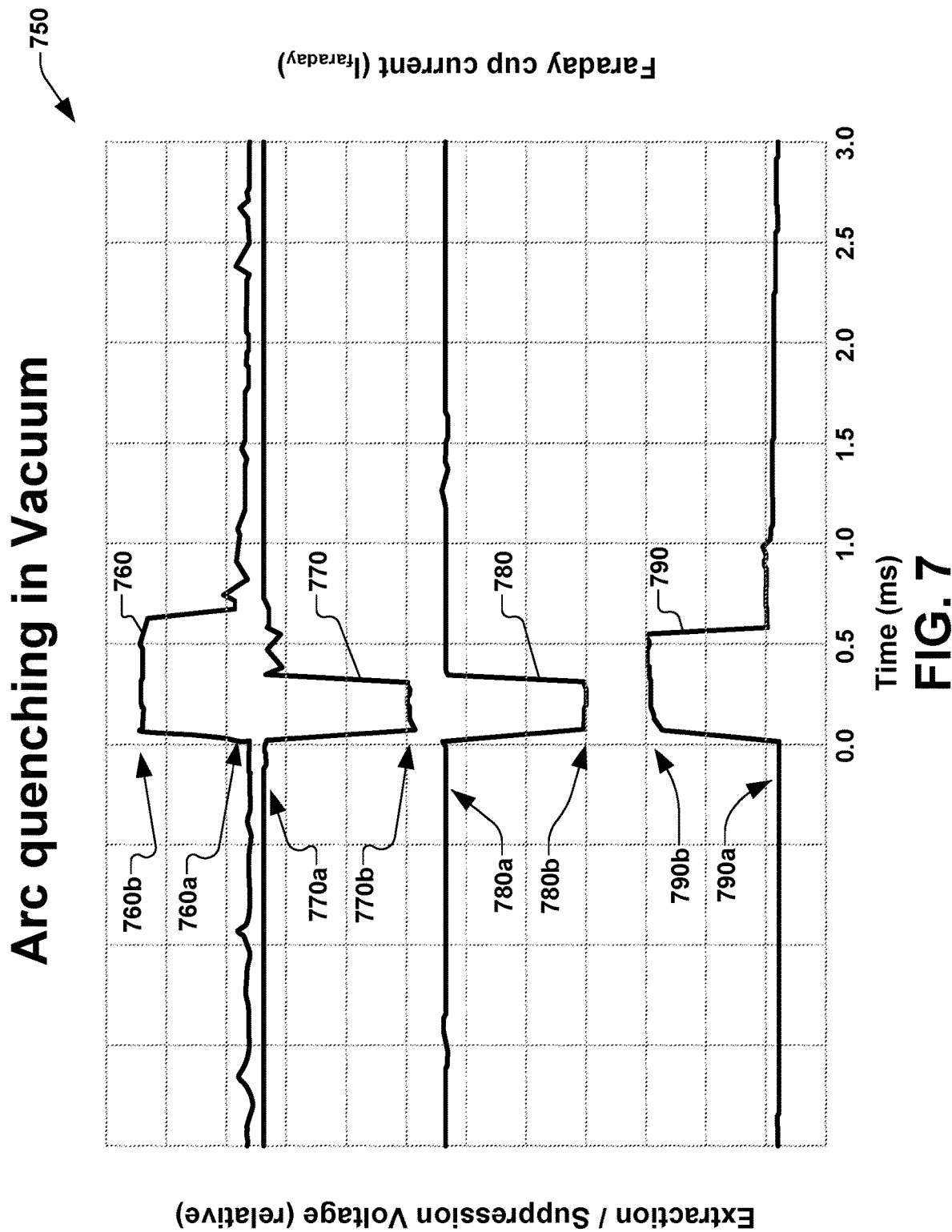
FIG. 7 is a graphical representation depicting the arc quenching effects of opening and closing a HVHS switch of an exemplary arc quenching circuit tested in a vacuum during arcing of an extraction electrode associated with an ion source.

FIG. 7 illustrates the arc quenching effects of opening and closing a HVHS switch of the arc quenching circuit of the present invention tested in a vacuum, during arcing of an extraction electrode associated with an ion source. A plot 750 illustrates relative amplitude level of signals provided by an arc quenching circuit (e.g., 602 of FIG. 6), in accordance with the present invention during arcing of an extraction electrode (e.g., 126a of FIG. 2A) associated with an ion source (e.g., 114 of FIGS. 2A and 6), as tested in the actual vacuum environment, for example, of an ion implantation system. FIG. 7 further illustrates the faraday current detected 760, during the opening and closing of a HVHS switch (e.g., 606 of FIG. 6) as measured at the extraction electrode voltage $V_{ext}$ 770. The ion source is fed by a high positive supply voltage and, as triggered by a $V_{ext}$ trigger control signal 780 generated by the trigger control circuit (e.g., 614 of FIG. 6) in response to an arc detection signal from the arc detection circuit (e.g., 602 of FIG. 6), has a suppression voltage $V_{sup}$ 790, which is fed by a high negative supply voltage. FIG. 7 further illustrates a voltage 770 across a HVHS switch 606 when the switch is closed producing a high $V_{ext}$ level 770a and when the switch is open producing a low $V_{ext}$ level 770b, the high voltage supply $V_b$ 730 at the supply 604, and the high voltage $V_a$ 720 as seen at the load (e.g., ion source 114).

Prior to time 0.0, when an arc occurs, the detected faraday current $I_{faraday}$ 760 is at a high level 760a, the positive power supply voltage for electrode voltage $V_{ext}$ 770 is at a high positive voltage level 770a, the negative power supply voltage for electrode voltage $V_{sup}$ 790 is at a low negative voltage level 790a, and $V_{ext}$ trigger control signal 780 provides a switch closed 780a signal to switch 606 of FIG. 6, which produces a high $V_{ext}$ level 770a. At time 0.0 of FIG. 7, an arc occurs on the high voltage supply (e.g., $V_a$ 720), for example, at the $V_{ext}$ electrode, and the $V_{ext}$ 770 and $V_{sup}$ 790 voltages quickly drop to zero, for example, as shown at 770b and 790b, respectively. In response, the current detected by CT 612, for example, is received by arc detection circuit 618 of FIG. 6, and in response the arc detection circuit provides the detection signal to the trigger control circuit 614 which generates 780b signal on $V_{ext}$ trigger control signal 780 of FIG. 7 to control HVHS switch 606 to open, which produces a low $V_{ext}$ level 770b. In addition, the detected faraday current $I_{faraday}$ 760 drops to a low current level 760b. With the HVHS switch now open, and after about 0.3 ms, the $V_{ext}$ trigger control signal 780 returns to the 780a level indicating that the arc has been extinguished, and $V_{ext}$ trigger control signal 780 controls the HVHS switch to re-close, and in response $V_{ext}$ 770 returns to the 770a level. Thereafter, at around 0.6 ms, and with the arc extinguished, the supply voltage at the load begins to recover enough for $V_{sup}$ 790 to recover to the $V_{sup}$ 790a level again, and shortly thereafter at about 0.65 ms-0.7 ms the beam current recovers as indicated by $I_{faraday}$ 760 recovering back to the 760a level. Thus, it is shown that the arc quench circuit of the present invention is able to quench an arc in the high voltages electrodes of an ion implantation system, for example, and minimize the length of an ion beam glitch to about 0.7 ms. With the disclosed arc quenching techniques, the length of the ion beam glitch may be reduced even further to the range of 200-270 µs.

Figure 8:
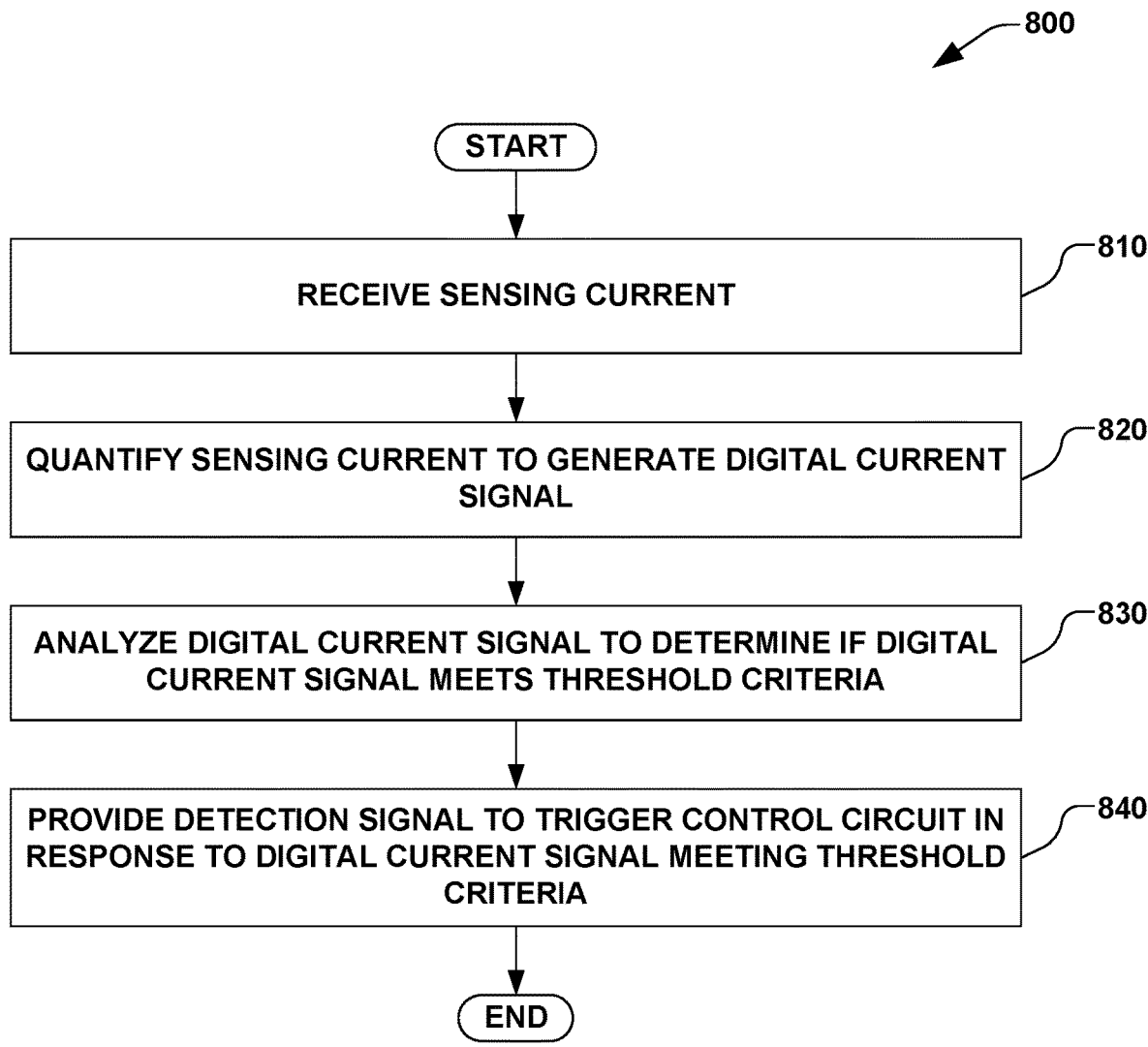
FIG. 8 is a flow diagram of an exemplary method for detecting and arc and providing an arc detection signal to an arc quenching mechanism in accordance with one or more aspects of the present invention.

One exemplary method 800 for detecting and extinguishing arcs in an ion implantation system is illustrated in FIG. 8. The method 800 may be performed by an arc quenching circuit (e.g., 188 of FIGS. 2A-2B, 202 of FIG. 2, and 602 of FIG. 6) of the present invention in accordance with several aspects of the present invention. Although the example method 800 is illustrated and described hereinafter as a series of acts or events, it will be appreciated that the present invention is not limited by the illustrated ordering of such acts or events. In this regard, some acts may occur in different orders and/or concurrently with other acts or events apart from those illustrated and/or described herein, in accordance with the invention. In addition, not all illustrated steps may be required to implement a methodology in accordance with the present invention. It is further noted that the methods according to the present invention may be implemented in association with the wafers, wafer cassettes, wafer sensor, wafer handling system, and modeling system illustrated and described herein as well as in association with other apparatus and structures not illustrated.

Method 800 includes, at 810, receiving a sensing current indicative of a current being supplied to one or more electrodes in the ion implantation system. At 820 the sensing current is quantified quantifying the sensing current to generate a digital current signal. At 830 the method includes, with digital processing circuitry, analyzing the digital current signal to determine whether the digital current signal meets a threshold parameter value. At 840, in response to the digital current signal meeting the threshold parameter value, the method includes providing a detection signal to a trigger control circuit that activates an arc quenching mechanism.

The HVHS switches are basically applied to the extraction systems of any ion sources. It will be appreciated that the aspects described herein are equally applicable to other ion sources including those that provide primary electron beam current in "soft ionization" ion sources, RF or microwave power in RF or microwave ion sources, as well as to non-arc discharge sources.

Although the invention has been illustrated and described above with respect to a certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", "with" and variants thereof are used in either the detailed description or the claims, these terms are intended to be inclusive in a manner similar to the term "comprising". Also, the term "exemplary" as utilized herein simply means example, rather than finest performer. The use of the phrase "one or more of A, B, or C" is intended to include all combinations of A, B, and C, for example A, A and B, A and B and C, B, and so on.

What is claimed is:

1. A method of detecting an arc in an ion implantation system, comprising:
   receiving a sensing current indicative of a current being supplied to one or more electrodes in the ion implantation system;
   quantifying the sensing current to generate a digital current signal; and
   with digital processing circuitry:
      analyzing the digital current signal to determine whether the digital current signal meets a threshold parameter value; and
      in response to the digital current signal meeting the threshold parameter value, providing a detection signal to a trigger control circuit that activates an arc quenching mechanism.

2. The method of claim 1, further comprising, with the digital processing circuitry, selecting the threshold parameter value for detecting the arc based at least on a process recipe in use by the ion implantation system.

3. The method of claim 1, further comprising, with the digital processing circuitry, dynamically adjusting the threshold parameter value for detecting the arc based at least on an operating condition of the ion implantation system.

4. The method of claim 1, wherein:
   the threshold parameter value comprises a range of current values mapped to increments of time relative to a beginning time of a process sweep of the ion implantation system; and
   analyzing the digital current signal comprises:
      receiving a synchronization signal indicating the beginning time of the process sweep;
      comparing the digital current signal in each increment of time to the range of current values mapped to the increment of time; and
      generating the detection signal in response to the digital current signal falling outside the range of current values for at least one increment of time.

5. The method of claim 1, further comprising, with the digital processing circuitry:
   collecting digital current signal data for multiple process sweeps of the ion implantation system;
   statistically analyzing the digital current signal data to generate a statistical model;
   determining the threshold parameter value based on a statistical model; and
   storing the determined threshold parameter value in storage media for access in subsequent analyzing.

6. The method of claim 1, wherein analyzing the digital current signal comprises:
   identifying one or more stored threshold parameter values mapped to a process recipe in use by the ion implantation system;

reading the one or more threshold parameter values from storage media; and analyzing the digital current signal based on the one or more threshold parameter values.

7. The method of claim 6, further comprising determining the threshold parameter values based at least on an operating condition of an ion implantation system.

8. The method of claim 7, wherein the one or more threshold parameter values include one or more of a quench time, a stabilize time, an arc duration time, or a current threshold.

9. The method of claim 6, further comprising:

scaling at least one of the threshold parameter values based on a magnitude of the digital current signal; and analyzing the digital current signal based on the at least one scaled threshold parameter values.

10. The method of claim 1, wherein quantifying the sensing current comprises providing the sensing current to an input of an analog-to-digital converter (ADC) such that a signal output by the ADC in response to the sensing current is the digital current signal.

11. The method of claim 1, wherein analyzing the digital current signal comprises:

providing the digital current signal to a field programmable gate array (FPGA); and with the FPGA, comparing the digital current signal to threshold parameter values stored in registers associated with the FPGA.

12. An arc detection circuit for detecting an arc in an ion implantation system, comprising:

an analog-to-digital converter (ADC) configured to convert a sensing current indicative of a current being supplied to an electrode in the ion implantation system to a digital current signal that quantifies the sensing current; and an analysis circuit configured to:

analyze the digital current signal to determine if the digital current signal meets a threshold parameter value; and in response to the digital current signal meeting the threshold parameter value, provide an arc detection signal to a trigger control circuit that activates an arc quenching mechanism.

13. The arc detection circuit of claim 12, wherein the ADC comprises a low latency ADC having a sampling rate of at least 40 mega samples per second.

14. The arc detection circuit of claim 12, wherein the analysis circuit comprises a field programmable gate array (FPGA) that includes a plurality of registers configured to store one or more threshold parameter values, further wherein the FPGA is configured to compare the digital current signal to the one or more stored threshold parameter values to determine if the threshold parameter value is met.

15. The arc detection circuit of claim 14, further comprising:

storage media configured to store multiple sets of threshold parameter values, and wherein the FPGA is configured to:

select a set of threshold parameter values based on a process recipe in use by the ion implantation system;

store the set of threshold parameter values in the plurality of registers; and read contents of the plurality of registers when analyzing the digital current signal.

16. The arc detection circuit of claim 15, further comprising an interface circuit configured to:

receive data corresponding to a set of threshold parameter values and a process recipe; and store the data in the storage media in a manner that maps the set to the process recipe.

17. The arc detection circuit of claim 12, wherein the analysis circuit comprises a processor configured to:

collect digital current signal data for multiple process sweeps of the ion implantation system;

statistically analyze the digital current signal data to generate a statistical model;

determine the threshold parameter value based on a statistical model; and store the determined threshold parameter value in storage media for access in subsequent analyzing.

18. An analysis circuit, comprising:

hardware processing components configured to compare a digital current signal to a threshold parameter value and in response to the digital current signal meeting the threshold parameter value, provide an arc detection signal to a trigger control circuit that activates an arc quenching mechanism; and a processor configured to dynamically determine the threshold parameter value.

19. The analysis circuit of claim 18, wherein the processor is configured to determine the threshold parameter value based at least on a process recipe in use by an ion implantation system.

20. The analysis circuit of claim 18, wherein the processor is configured to:

collect digital current signal data over a plurality of scans of an ion beam;

statistically model the collected digital current signal data; and determine the threshold parameter value based at least on the statistically modeled digital current signal data.

21. The analysis circuit of claim 18, wherein the processor is configured to:

read a stored threshold parameter value; and scale the threshold parameter value based at least on an operating condition of an ion implantation system.

22. The analysis circuit of claim 18, wherein the one or more threshold parameter values include one or more of a quench time, a stabilize time, an arc duration time, or a current threshold.

* * * * *